(12) United States Patent
Kadkol et al.

(10) Patent No.: US 10,243,762 B1
(45) Date of Patent: Mar. 26, 2019

(54) ANALOG DELAY BASED FRACTIONALLY SPACED N-TAP FEED-FORWARD EQUALIZER FOR WIRELINE AND OPTICAL TRANSMITTERS

(71) Applicant: MACOM Technology Solutions Holdings, Inc., Lowell, MA (US)

(72) Inventors: Aniket Kadkol, Santa Clara, CA (US); Mahmoud Reza Ahmadi, Santa Clara, CA (US); Echere Iroaga, Santa Clara, CA (US)

(73) Assignee: MACOM CONNECTIVITY SOLUTIONS, LLC, Lowell, MA (US)

( * ) Notice: Subject to any disclaimer, the term of this patent is extended or adjusted under 35 U.S.C. 154(b) by 0 days.

(21) Appl. No.: 15/953,641

(22) Filed: Apr. 16, 2018

(51) Int. Cl.
| | |
|---|---|
| *H03K 5/135* | (2006.01) |
| *H04L 25/03* | (2006.01) |
| *H03K 5/133* | (2014.01) |
| *H04L 7/00* | (2006.01) |
| *H04B 10/564* | (2013.01) |
| *H03K 5/00* | (2006.01) |

(52) U.S. Cl.
CPC ....... *H04L 25/03063* (2013.01); *H03K 5/133* (2013.01); *H03K 5/135* (2013.01); *H04B 10/564* (2013.01); *H04L 7/0025* (2013.01); *H04L 7/0041* (2013.01); *H04L 25/03343* (2013.01); *H03K 2005/00156* (2013.01); *H03K 2005/00195* (2013.01); *H03K 2005/00234* (2013.01); *H03K 2005/00286* (2013.01); *H04L 2025/03509* (2013.01)

(58) Field of Classification Search
CPC ............ H04L 25/03063; H04L 7/0041; H04L 25/03343; H04L 7/0025; H04L 2025/03509; H03K 5/135; H03K 5/133; H03K 2005/00195; H03K 2005/00286; H03K 2005/00156; H03K 2005/00234; H04B 10/564
USPC .......................................... 398/194; 375/376
See application file for complete search history.

(56) References Cited

U.S. PATENT DOCUMENTS

| | | |
|---|---|---|
| 6,167,082 A | 12/2000 | Ling et al. |
| 6,369,627 B1 * | 4/2002 | Tomita ..................... G11C 7/22 327/158 |
| 6,987,803 B2 | 1/2006 | Frenkel et al. |
| 8,611,408 B2 | 12/2013 | Xia et al. |

(Continued)

*Primary Examiner* — Don N Vo
(74) *Attorney, Agent, or Firm* — Amin, Turocy & Watson LLP

(57) ABSTRACT

An analog-based architecture is used to produce tap spacings in an n-tap fractionally-spaced equalizer without the need for digital clock-driven elements. The analog voltage-controlled delay cell circuits control the amount of applied delay based on the measured phase difference between quarter-rate clock signals. Because low speed clock signals are sufficient for comparison purposes, the analog delay cells can be placed before the quarter-rate multiplexors in the data path. The use of analog-based delay cells eliminates the need to route high-speed clock signals to multiple digital delay elements that are typically used to achieve fractionally spaced data signals in n-tap FIR equalizers. Timing margin issues can also be eliminated since digital clocked elements are not used to produce the fractionally spaced delays. The analog-based delay approach also consumes less power relative equalizers that use multiple digital delay elements requiring high speed clock signals.

20 Claims, 10 Drawing Sheets

(56) References Cited

U.S. PATENT DOCUMENTS

| | | | |
|---|---|---|---|
| 8,867,603 B1 | 10/2014 | Lida et al. | |
| 9,166,703 B2 | 10/2015 | Secondini et al. | |
| 9,166,833 B2 | 10/2015 | Eliaz | |
| 9,503,293 B2 | 11/2016 | Kim | |
| 2003/0155953 A1* | 8/2003 | Hirata | H03K 5/1504 |
| | | | 327/236 |
| 2008/0181348 A1* | 7/2008 | Best | G06F 1/10 |
| | | | 375/376 |
| 2015/0162922 A1* | 6/2015 | Song | H04L 7/0091 |
| | | | 375/376 |

* cited by examiner

ANALOG DELAY BASED FRACTIONALLY SPACED N-TAP FEED-FORWARD EQUALIZER FOR WIRELINE AND OPTICAL TRANSMITTERS

TECHNICAL FIELD

The subject disclosure relates generally to delay cell structures for use in, for example, n-tap finite impulse response transmit equalizers.

BACKGROUND

Many electrical and optical systems, such as integrated circuits, system-on-chip (SoC) architectures, very large scale integration (VLSI) systems, and printed circuit boards, include circuit components linked by wireline or optical communication channels. These channels facilitate data exchange between the components, as in the case of chip-to-chip communication over backplane channels.

The increasing performance capabilities of many widely used applications, such as high definition video streaming and other computationally heavy applications, have placed increasingly high demands for processing speed on the underlying data processing systems that drive these applications. To support the high processing speeds required by many applications, communication channels between chips of a processing system—or between interconnected processing applications—must be capable of transmitting data at high speeds between components while maintaining low loss and high transmission fidelity. Equalization circuits, such as n-tap finite impulse response (FIR) transmit equalizers, are often used to pre-shape data signals prior to transmission across these communication channels to counteract the effects of channel loss and intersymbol interference (ISI) caused by these channels due to skin effect or dielectric loss.

The above-described description is merely intended to provide a contextual overview of current techniques and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In one or more embodiments, a system for controlling a delay applied to a data signal is provided, comprising a delay cell circuit configured to apply a voltage-controlled delay to incoming data signals, wherein the voltage-controlled delay is controlled by an analog control voltage, one of the data signals is a clock signal, and the delay cell circuit applies the voltage-controlled delay to the clock signal to yield a delayed clock signal; a phase interpolator configured to mix a first phase of the clock signal and a second phase of a 90° phase-shifted version of the clock signal to yield an interpolated clock signal having an interpolated phase between 0° and 90°; and a phase detection component configured determine a difference between a third phase of the delayed clock signal and the interpolated phase of the interpolated clock signal, and to set the analog control voltage based on the difference.

Also, according to one or more embodiments, a method is provided, comprising delaying, by a delay cell circuit of an n-tap transmit equalizer, a clock signal to yield a delayed clock signal, wherein the delaying comprises delaying the clock signal by a delay amount set by an analog control voltage; mixing, by a phase interpolator circuit of the n-tap transmit equalizer, a first phase of the clock signal and a second phase of a 90° phase-shifted version of the clock signal to yield an interpolated clock signal having an interpolated phase between 0° and 90°; determining, by a phase detection circuit of the n-tap transmit equalizer, a difference between a third phase of the delayed clock signal with the second phase of the interpolated clock signal; and setting, by the phase detection circuit, a value of the analog control voltage based on the difference.

In addition, an n-tap finite impulse response transmit equalizer is provided, comprising a delay block configured to convert a data stream to three or more fractionally spaced data streams, the delay block comprising: multiple delay cell circuits, wherein each of the multiple delay cell circuits applies a voltage-controlled delay to an incoming data stream in accordance with an analog control voltage, and a delay cell circuit, of the delay cell circuits, applies the voltage-controlled delay to a clock signal to yield a delayed clock signal; a phase interpolator circuit configured to interpolate a first phase of the clock signal and a second phase of a 90° phase-shifted version of the clock signal to yield an interpolated clock signal having an interpolated phase between 0° and 90°; and a phase detection component configured to set the analog control voltage to a value that causes a third phase of the delayed clock signal to align or substantially align with the interpolated phase of the interpolated clock signal.

DETAILED DESCRIPTION

Figure 1:
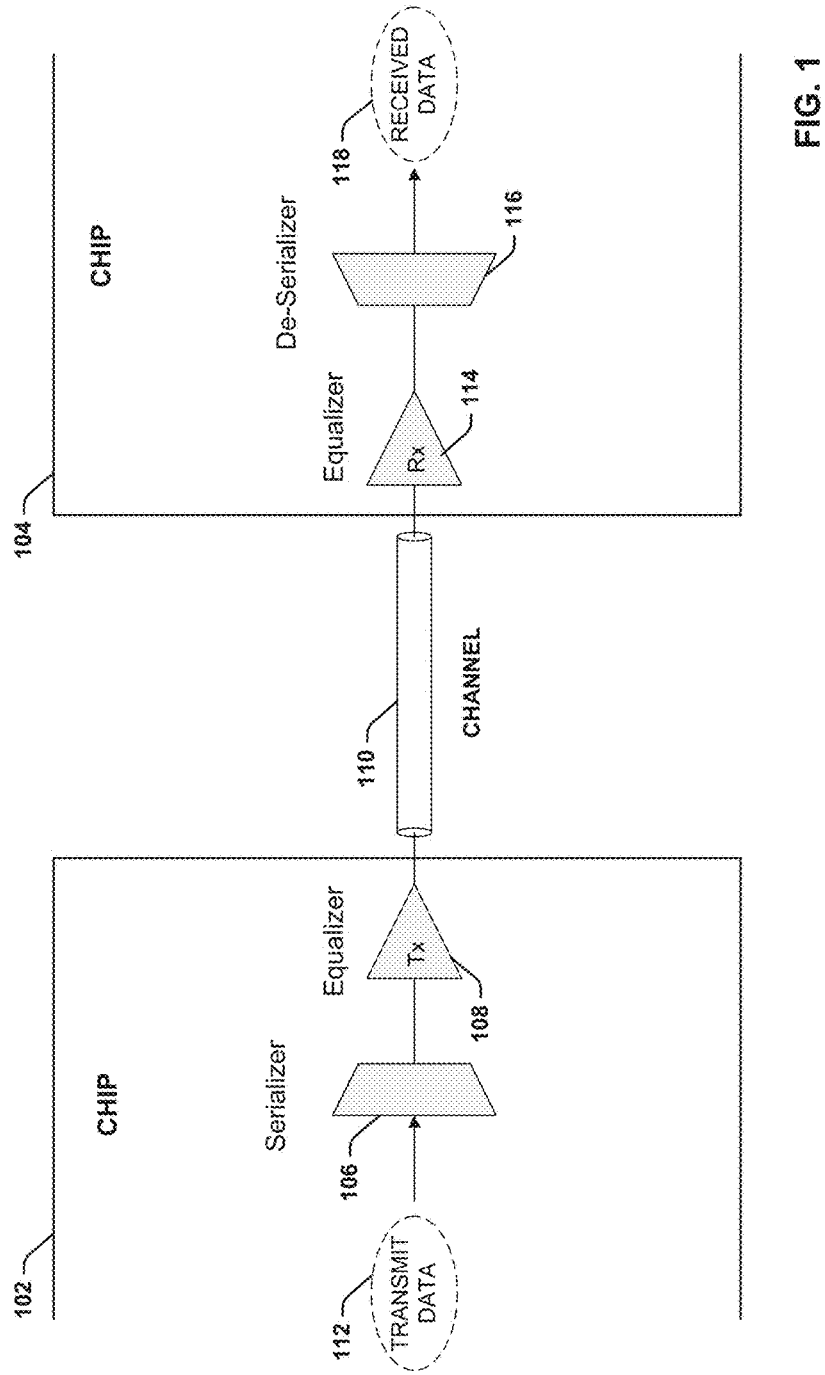
FIG. 1 is a generalized diagram illustrating a communication channel between two chips of an example high-speed digital system.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

FIG. 1 is a generalized diagram illustrating a communication channel 110 between two chips (102 and 104) of an example high-speed digital system. Chips 102 and 104 may be components (e.g., integrated circuits) of substantially any type of high-speed electronic or optical system or application, including but not limited to a video display system, a communication system, a gaming system, an augmented reality or virtual reality system, or other such applications. Chips 102 and 104 can exchange data over communication channel 110, which communicatively links the two chips. channel 110 can implemented using any suitable type of communication architecture that facilitates data transmission between chips 102 and 104. For example, at least a portion of channel 110 may comprise one or more electrically conductive traces (e.g., traces of a printed circuit board) that connect an output line of chip 102 with an input line of chip 104. Channel 110 may also include one or more backplane connectors that link two or more circuit boards together (e.g., for architectures in which chips 102 and 104 reside on different physical boards).

In an example application, chip 102 may be designed to send selected items of data 112 generated by the chip 102 to the other chip 104 via channel 110. In the illustrated example, a serializer 106 serializes the data 112 prior to transmission via channel 110. At the receiving chip 104, a de-serializer 116 deserializes the incoming data signal to recover the transmitted data as received data 118.

Chip-to-chip communication channels (e.g., channel 110) are typically lossy data transmission paths, and the data signals transmitted over these channels are often subject to skin effect or dielectric loss. As a result, high-frequency components of the transmitted data signal are attenuated or lost during transmission, which can distort the transmitted data symbols and reduce the accuracy of the received data 118 at the receiving chip 104. To counteract the effects of channel loss, a finite impulse response (FIR) transmit equalizer 108 may be used to pre-shape the data signal by boosting the high frequency signal components and attenuating the low frequency components before placing the signal on the channel 110. At the receiving chip 104, a receive equalizer 114 performs post-shaping of the received data signal to emphasize the high frequency components before the signal is de-serialized.

Figure 2:
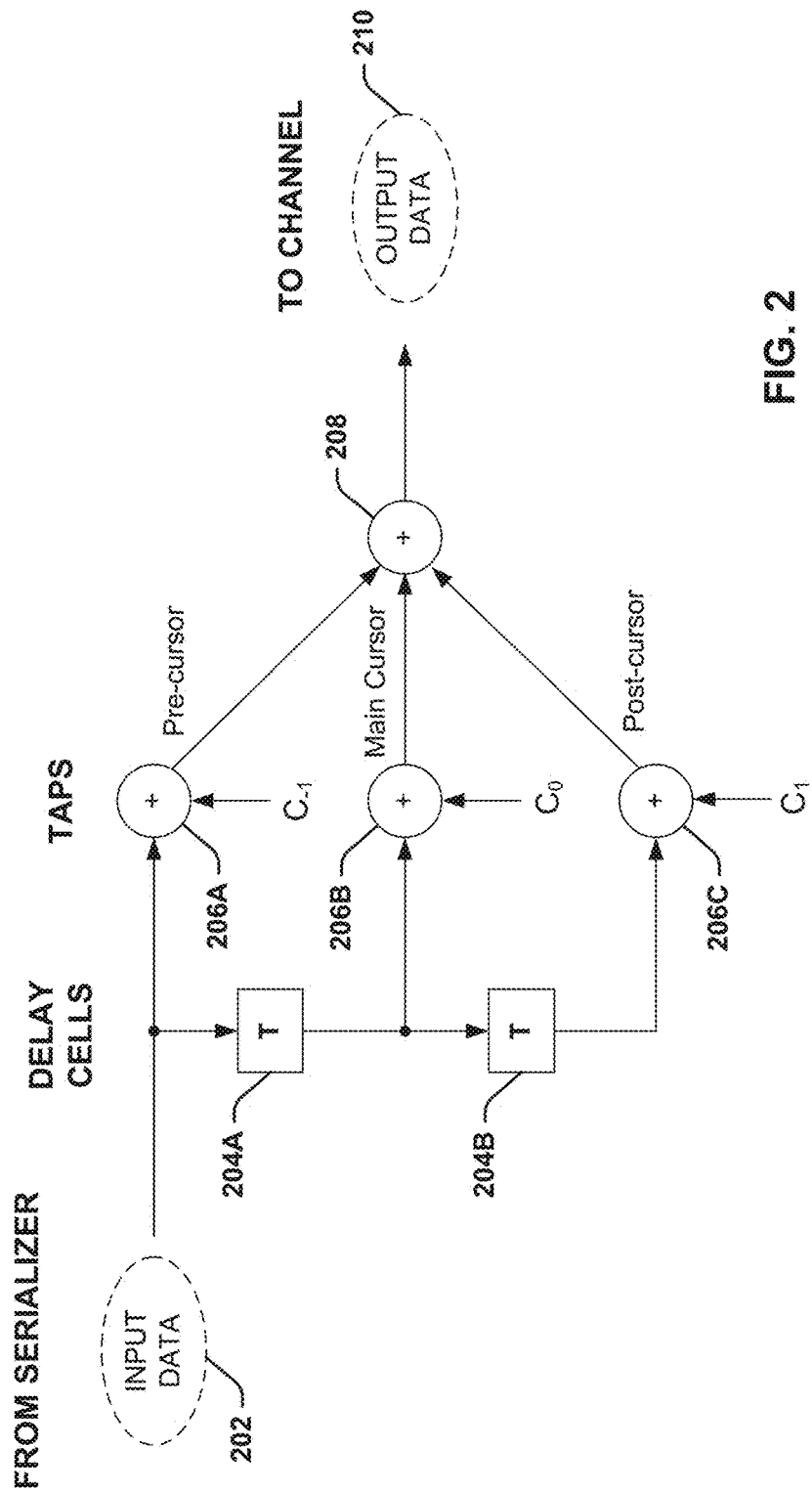
FIG. 2 is a diagram illustrating an example T-spaced (or symbol spaced) FIR equalizer design.

FIG. 2 is a diagram illustrating an example 1 T-spaced (or symbol spaced) FIR equalizer design, where T is a symbol period. In this example design, the serialized input data 202 is passed through a number of delay cells 204, each of which introduces a unit interval (UI) time delay to the signal (i.e., a time delay of (1/DataRate), where DataRate is the data rate of the data stream). The example depicted in FIG. 2 is a design for a three-tap equalizer, and so delay cells 204A and 204B are used to produce three data streams, where each data stream is delayed relative to its preceding stream by (1/DataRate). Programmable taps 206 then apply weighted values $C_{-1}$, $C_0$, and $C_1$ to the resulting 1 T-spaced data streams (also referred to as symbol-spaced data streams or UI-spaced data streams). That is, tap 206A applies weight value $C_{-1}$ to the non-delayed data stream (or pre-cursor), tap 206B applies weight value $C_0$ to the output of delay cell 204A (or the main cursor), and tap 206C applies weight value $C_1$ to the output of delay cell 204B (or the post-cursor). Typically, weight value $C_0$ is a positive value in order to boost the main cursor signal, while weight values $C_{-1}$ and $C_1$ are negative values in order to reduce pre-cursor and post-cursor inter-symbol interference (ISI). The equalizer then combines the weighted data streams (represented by adder 208) to yield an output data stream 210, which is sent out on channel 110. Although only three taps are depicted in FIG. 2, some n-tap equalizers may include more than three taps, allowing multiple 1 T-spaced pre-cursor and post-cursor data streams to be filtered.

Typically, delay cells 204 create the tap spacing using digital delay elements such as flip flops and latches. These digital delay elements are driven by the system's high speed clock, which may have a clock frequency of half the data rate of the data stream. As applications require higher data rates, higher speed clocks (e.g., 28 GHz) may be necessary to drive the final digital delay elements. Routing these high-speed clock signals to all necessary digital delay components can consume large amounts of power. These high frequency clocking requirements can also create timing margin issues as the time windows during which data may be sent becomes smaller. For at least these reasons, the use of digital elements to produce tap spacings in a transmit equalizer for applications requiring high data speeds yields inefficiencies in terms of both power consumption and system performance.

To address these and other issues, one or more embodiments described herein leverage analog delay elements to produce the required tap spacings in an n-tap UI-spaced equalizer without the need for clock-driven digital elements. In an example embodiment, the delay cells reference the delay difference between quarter-rate clocks in order to control analog delay elements. These analog delay elements can be placed before the equalizer's quarter-rate multiplexors in the data path. The resulting analog-based delay does not require high-speed clock signals to be routed to multiple digital delay elements. Moreover, timing margin issues are mitigated since digital clocked elements are not used to produce the 1 T-spaced (or UI-spaced) delays. This approach can considerably reduce the amount of power and area required to produce the 1 T-spaced delays by eliminating the need to route clock signals to individual digital element, and by using local half-rate clock generation for the creation of tap spacing between the data streams.

Similar analog-based techniques can also be used to achieve fractionally-spaced data streams (e.g., 0.5 T or 0.75 T), as will be described herein.

Figure 3:
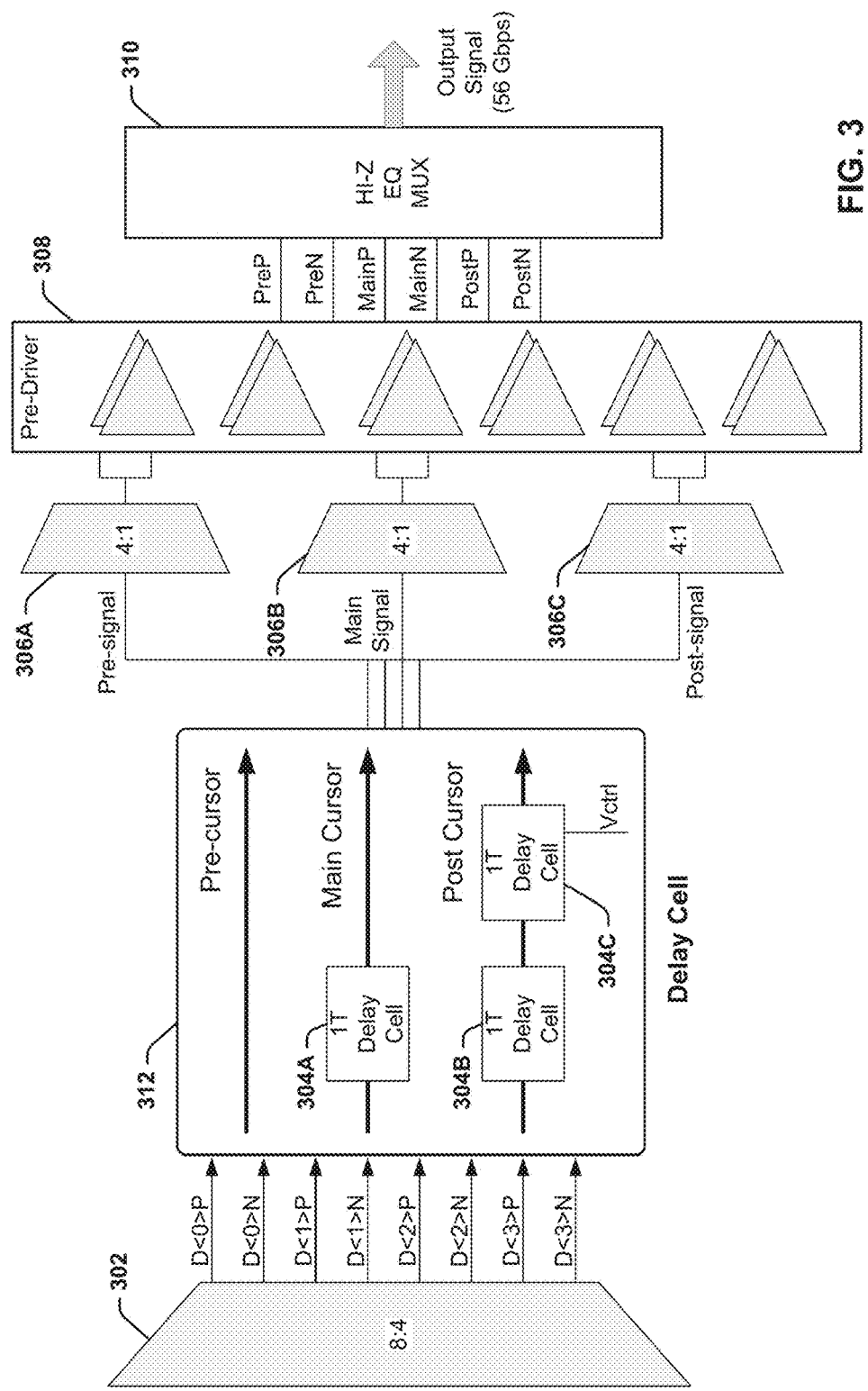
FIG. 3 is a diagram of an example T-spaced FIR equalizer design that uses analog-based delay to create T-spaced data streams.

FIG. 3 is a diagram of an example 1 T-spaced FIR equalizer design that uses analog voltage-controlled delay cells to create 1 T-spaced data streams. For simplicity, a three-tap equalizer architecture is depicted in FIG. 3. However, the analog-based delay techniques described herein are suitable for use in n-tap equalizers having any number of delay blocks and taps. Also, these delay techniques are not limited to use within n-tap equalizers, but rather can also be used to create desired data signal delays in other types of electronic or optical circuits.

In this example architecture, serialized data from serializer 302 is sent to a delay block 312, which generates the pre-cursor, main cursor, and post-cursor T-spaced delay streams. To produce the pre-cursor data signal, the delay block 312 allows the incoming data signal to pass without delay. The main cursor data stream is produced by passing the incoming data signal through a single 1 T delay cell 304A (that is, a cell that delays the signal by a delay time duration equivalent to one symbol period), while the post-cursor data stream is produced by passing the incoming data signal through two 1 T delay cells 304B and 304C. The resulting pre-signal, main signal, and post signal are sent to respective quarter-rate multiplexors 306A, 306B, and 306C. These multiplexors 304 receive the 1 T space delayed pre-signal, main signal, and post-signal at a given data rate (e.g., 14 Gbps) and produces corresponding output signals at the output data rate (e.g., 56 Gbps). The outputs of multiplexors 306 are then passed through a pre-driver 308, and the tap weights are applied to the output signals from the pre-driver 308 by a hi-z equalization multiplexor 310. The weighted output signals (the outputs of multiplexor 310) are then combined and sent out on the channel (e.g., as a 56 Gbps signal). The equalizer architecture depicted in FIG. 3 is only intended to be exemplary, and it is to be appreciated that the analog delay block 312 can be used in equalizers having other architectures.

Assuming a 14 GHz master clock, if the delay cells 304 of this example three-tap architecture were to be implemented using digital delay elements as in conventional implementations, each delay cell 304 would require a clock signal to be routed to its associated digital elements. Moreover, applications with high speed requirements would necessitate the use of high-frequency clock signals to drive these digital delay elements. For example, if the delay block 312 receives data streams as a data rate of 14 Gbps, a 28 GHz clock signal (a half-rate clock with clock pulses having a frequency of half the 56 Gbps output data rate) would be required to drive the digital elements to achieve a 1 T spacing. This high frequency clock requirement can cause timing constraints on data transmission. Routing these high frequency clock signals to all digital delay elements also drastically increases overall power consumption due to the additional power required to drive the 28 GHz clock lines to the digital elements.

Figure 4:
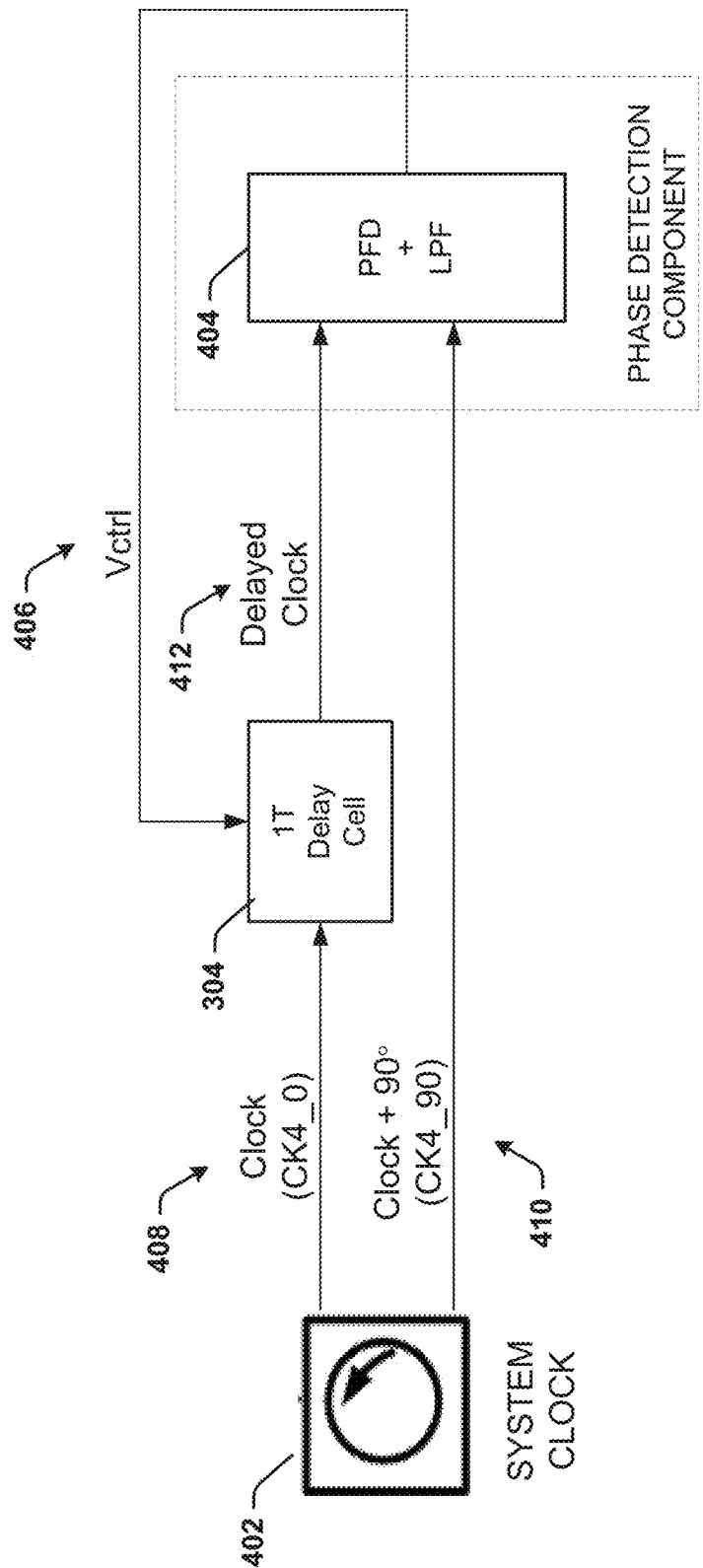
FIG. 4 is a diagram of an example circuit architecture for controlling an analog-based delay cell to achieve a symbol-spaced delay.

Accordingly, one or more embodiments described herein employ analog-based delay cells 304 to achieve the 1 T spacing of data signals. FIG. 4 is a diagram of an example circuit architecture for controlling an analog-based delay cell to achieve a symbol-spaced delay according to one or more embodiments. In general, rather than controlling the delay output of the delay cell using a high frequency clock signal routed to digital elements of the delay cells, the delay of the analog-based delay cell 304 is regulated by an analog control voltage Vctrl, which is itself generated based on a comparison between two phases of the clock signal, where one of the clock signals has been delayed by one of the delay cells 304.

Generation of the analog delay control voltage Vctrl is now described. The analog-based delay approach uses two phases of the system clock 402. Since the delay control signal is based on a comparison between these two phases, a relatively low frequency clock signal can be used for comparison purposes. For example, for the example 56 Gbps architecture illustrated in FIG. 3, a 14 Hz quarter-rate clock (a quarter of the output data rate 56 Gbps) can be used. The 0° phase clock signal 408 for the 14 GHz system clock 402 is provided as an input to the 1 T delay cell 304. Based on the input clock signal 408 and the control voltage Vctrl that controls the cell's delay, delay cell 304 delays clock signal 408 to yield a delayed clock signal 412 as an output. This delayed clock signal 412 is provided as one input to a phase detection component, such as a phase frequency detector (PFD) 404 with a low-pass filter (LPF).

In order to achieve a 1 T delay (that is, a delay equal to the width of one symbol), the 1 T delay cell 304 must produce a delay equivalent to a 90° phase shift of the clock signal 408. Accordingly, the 90° phase clock signal 410 from system clock 402 is provided as a second input to the PFD 404 for comparison with the delayed clock signal 412 (the output of delay cell 304). Like the 0° phase clock signal, the 90° phase clock signal 410 is sourced by the system clock 402. However, the 90° phase clock signal 410 is shifted relative to the 0° phase clock signal by 90° (that is, the rising edge of a clock pulse of the 90° clock signal 410 is delayed by 90°, or ¼ of the clock cycle, relative to the rising edge of a corresponding clock pulse of the 0° clock signal 408).

If the 1 T delay cell 304 is achieving an accurate 1 T delay, the phase of the delayed clock signal 412 (that is, the version of the 0° clock signal 408 delayed by delay cell 304) will match the phase of the 90° clock signal 410 provided by the system clock 402. The PFD 404 (or another type of phase detector or phase comparator) compares the delayed clock signal 412 from the delay cell 304 with the 90° phase clock signal 410 from the system clock 402. Based on the difference between signal 412 and signal 410, PFD 404 adjusts control voltage Vctrl 406, which controls the amount of delay applied by delay cell 304. PFD 404 adjusts the control voltage Vctrl 406 based on this phase difference until the phase of the delayed clock signal 412 is determined to match the phase of the 90° clock signal 410 from the system clock 402. The phases of signals 412 and 410 are determined to match when the rising edge of a pulse of delayed clock signal 412 is aligned (or substantially aligned within a defined tolerance) with the rising edge of a corresponding pulse of the 90° clock signal 410. The control voltage Vctrl 406 generated by PFD 404 is provided to all the delay cells 304 that make up the delay block 312.

Although a PFD 404 is depicted in FIG. 4 as the means for comparing the two input signals 412 and 410, other types of phase detectors or phase comparators for comparing phases of the two input signals 412 and 410 and generating a suitable control voltage Vctrl 406 based on the difference between the two phases are within the scope of one or more embodiments.

Figure 5B:
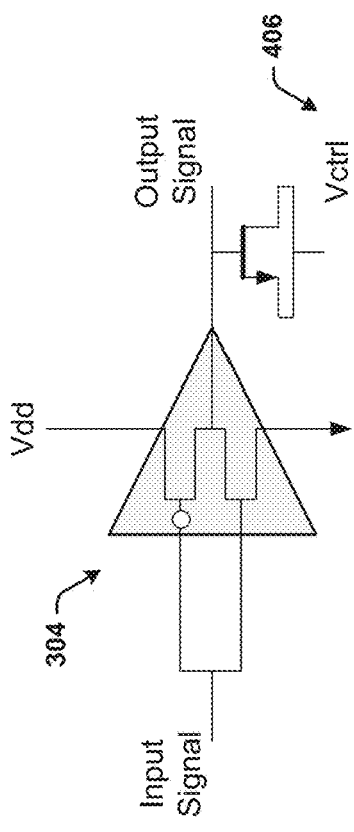
FIG. 5b is a diagram of another example analog delay element that can be used to implement delay cells.
Figure 5A:
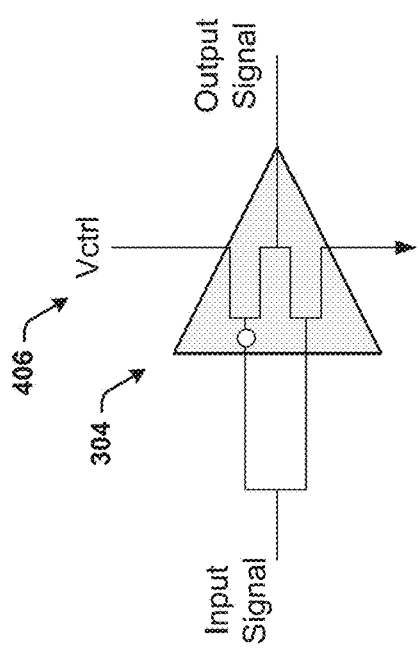
FIG. 5a is a diagram of an example analog delay element that can be used to implement delay cells.

FIGS. 5a and 5b are diagrams of example analog delay elements that can be used to implement delay cells 304. FIGS. 5a and 5b are active delay elements in which the control voltage Vctrl 406 sets the propagation delay of a CMOS inverter circuit (e.g., a current starved inverter). In the example delay cell of FIG. 5a, the control voltage Vctrl 406 is applied to the source terminal of the CMOS inverter's PMOS transistor, such that the delay of the output signal relative to the input signal is a function of Vctrl.

The example delay cell of FIG. 5b also leverages a CMOS inverter circuit. In this example, the control voltage Vctrl 406 is applied to a Varactor. The Vctrl voltage changes the value of load cap and hence can be used to modulate the propagation delay. This alternative configuration also allows the propagation delay to be set as a function of the control voltage Vctrl 406.

It is to be appreciated that the example delay cells depicted in FIGS. 5a and 5b are only intended to be exemplary. In general, delay cells 304 can be implemented using any type of analog circuit capable of delaying an input signal by an adjustable delay amount set by an analog control voltage, including but not limited to analog delay-locked loop (DLL) circuits, analog differential buffer delay elements, MOS diode-based delay elements, tunable logic gate-based delay elements, or other such structures.

The example analog-based delay technique described above in connection with FIG. 4—in which the control voltage Vctrl 406 is generated based on a comparison between the 90° clock signal 410 and the delayed 0° clock signal 412—is suitable for applications in which a 1 T-spaced delay (that is, a symbol-spaced delay, or a delay equivalent to one symbol width) is desired. This is because the delay that must be applied to bring the phase of the 0° clock signal 412 into alignment with the 90° clock signal 410 is equivalent to a 1 T symbol-spaced delay. A similar analog approach can also be used to generate fractionally spaced delays (e.g., a 0.5 T delay, 0.75 T delay, etc.). Fractionally spaced equalization can be useful within the context of high-rate drivers or receivers, since it has been observed that greater equalization benefit, in terms of eye margins and reduced residual ISI, can be obtained when signal shaping is applied to middle portions of a symbol rather than at the end of the symbol, as occurs when 1 T spacing is used. These benefits become increasingly important as non-return to zero (NRZ) signaling is replaced by PAM-4 modulation, which is capable of faster serial data transmissions and smaller UI.

Conventional transmit FIR equalizers in which digital delay elements are used typically produce a static, non-programmable fractional spacing due to the fixed characteristics of the digital elements used to achieve the signal delays. Moreover, digital-based designs for creating fractionally spaced taps using digital flip flops and latches can require complicated clocking schemes. In addition to saving on power consumption and circuit area relative to digital-based delay approaches, some embodiments of the analog-based delay approach described herein can allow the user or designer to easily program the amount of delay spacing to achieve a desired fractional spacing without the need for complicated digital designs or clocking schemes.

Figure 6:
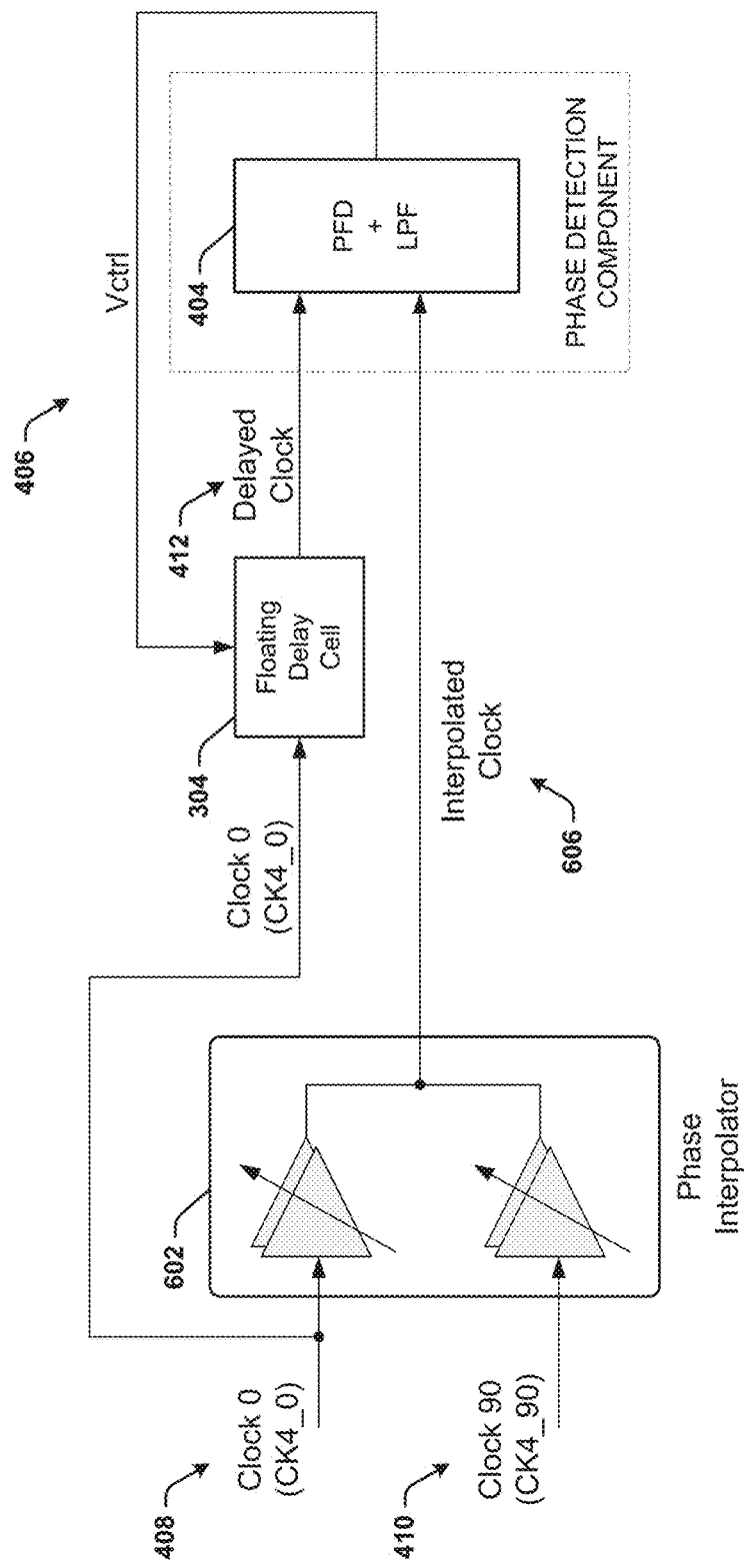
FIG. 6 is a diagram of an example circuit architecture for controlling an analog-based delay cell to achieve a fractionally spaced delay.

FIG. 6 is a diagram of an example circuit architecture for controlling an analog-based delay cell to achieve a fractionally spaced delay according to one or more embodiments. This fractionally spaced architecture is similar to the 1 T-spaced (symbol-spaced) architecture depicted in FIG. 4, in that the low speed (e.g., quarter-rate) 0° clock signal 412 is delayed by the delay cell 304, and a PFD 404 generates the delay control voltage Vctrl 406 based on a comparison of the phase of the resulting delayed clock signal 412 with the phase of another quarter-rate clock signal. However, rather than comparing the phase of the delayed clock signal 412 with the phase of the 90° clock signal 410, as in the 1 T-spaced scenario, this example compares the phase of the delayed clock signal 412 with the phase of an interpolated clock signal 606 having a phase greater than 0° and less than 90°.

In one or more embodiments, the interpolated clock signal 606 can be generated by providing the 0° clock signal 408 and the 90° clock signal 410 as inputs to a phase interpolator 602 (e.g., a voltage mode phase interpolator), which mixes the phases of the two clock signals 408 and 410 at a selected proportion and outputs the interpolated clock signal 606 at an interpolated phase between 0° and 90°. The phase of the interpolated clock 606 can be set by configuring respective weights to be applied to the phases of the 0° clock signal 408 and the 90° clock signal 410 by the phase interpolator 602. For example, applying full weight (e.g., a weight of 1) to the 0° clock signal 408 and zero weight to the 90° clock signal 410 will result in an interpolated clock signal 606 having a phase of 0°, since none of the 90° clock signal phase is being mixed with the 0° clock signal phase. At the other extreme, applying full weight to the 90° clock signal 410 and zero weight to the 0° clock signal 408 will yield an interpolated clock signal having a phase of 90°. Phases between these extreme 0° and 90° phases can be achieved by applying non-zero weights to the two clock signals. For example, applying full weight to both the 0° clock signal 408 and the 90° clock signal 410 will equally mix the two phases, resulting in an interpolated clock signal 606 having a phase of 45°. As the weight applied to the 0° clock signal 408 is decreased while maintaining full weight on the 90° clock signal 410, the phase of the interpolated clock signal 606 increases above 45°. Conversely, decreasing the weight applied to the 90° clock signal 410 while maintaining full weight on the 0° clock signal 408 causes the phase of the interpolated clock signal 606 to decrease below 45°. By configuring the weights applied by the phase interpolator 602 in this manner, the interpolated clock signal 606 can be configured to achieve any phase between 0° and 90°.

Similar to the examples described above in connection with FIG. 4, the PFD 404 compares the phase of the interpolated clock signal 606 with the phase of the delayed clock signal 412, which is a delayed version of the 0° clock signal 408 delayed by the delay cell 304. The PFD 404 adjusts the control voltage Vctrl 406 based on the phase difference between the delayed clock signal 412 and the interpolated clock signal, which in turn adjusts the delay applied by the delay cell 304 to the 0° clock signal 408. The PFD 404 continues to adjust the control voltage Vctrl 406 until the phase of the delayed clock 412 matches the phase of the interpolated clock signal 606, and the resulting control voltage Vctrl 406 is provided to all delay cells 304 making up the delay block 312 of the FIR equalizer. In this example, the delay cell 304 is referred to as a floating delay cell rather than a 1 T delay cell since the delay can be adjusted to a selected fraction below 1 T. However, the structure of these floating delay cells can be the same as those of the 1 T delay cells, the only difference being the addition of the phase interpolator 602 to generate the interpolated clock signal 606, which replaces the 90° clock signal 410 as the second input to the phase frequency detector 404.

Whereas using the 90° clock signal 410 as the basis for comparison with the delayed clock signal 412 as in FIG. 4 yields a 1 T-spaced (i.e., symbol-spaced) FIR equalizer, using an interpolated phase between 0° and 90° as the basis for comparison with the delayed clock signal 412 yields fractional spacing less than 1 T. For example, comparing the delayed clock signal 412 with an interpolated clock signal 606 having a 45° phase yields a 0.5 T (or 0.5 UI) spacing. Other fractional spacings can be achieved by suitably adjusting the phase of the interpolated clock signal 606 between 0° and 90° by altering the weights applied by the phase interpolator 602. Most applications that use fractionally spaced equalization will utilize a spacing within the range of 0.5 T to 1 T, since these spacings will cause the symbol to be shaped between the middle and the end of the symbol rather than at the front half of the symbol, which produces greater equalization benefits in terms of eye margins and reduced residual ISI.

FIR equalizers that achieve tap spacing using the analog-based delay techniques described herein offer a number of benefits relative to equalizers that use digital-base delay architectures. Since the control voltage Vctrl is generated based on a measured phase difference between two clock signals, relatively low frequency clock signals (e.g., quarter-rate clock signals, such as 14 GHz clock signals) can be used for comparison purposes. This allows the delay cells 304 to be placed before the quarter-rate multiplexors 306 to tap off of the quarter-rate system clock signal rather than the faster half-rate system clock, relaxing the design demand on the clocking scheme. This can also eliminate the need for a half-rate clock with duty cycle distortion (DCD) control, which is typically used to create n-tap spacing for FIR transmit equalizers. Moreover, since the analog delay cells 304 are driven by an analog control voltage rather than high speed clocks signals, there is no need to route high frequency clock signals to many individual digital components that are typically used to create n-tap spacing in FIR equalizers. Using an analog control voltage rather than a high speed clock signal to control the delay elements also eliminates potential timing margin issues associated with clock driven digital delay elements. Eliminating the high speed clock signal routing to the digital delay elements also yields considerable power savings, and reduces the amount of chip area that must be dedicated to n-tap spacing.

Although the disclosed analog-based delay control techniques have been described above in the context of n-tap FIR transmit equalizers, it is to be appreciated that the techniques described herein for achieving desired signal delays using analog delay control elements are suitable for use within other types of applications in which signal delays are required. In general, applications that typically employ clock-driven digital delay elements (e.g., flip flops and latches) can advantageously be re-designed to replace the digital delay components with the analog voltage-controlled delay cell circuits described herein, thereby saving power and reducing complexity of the overall circuit design.

Figure 7:
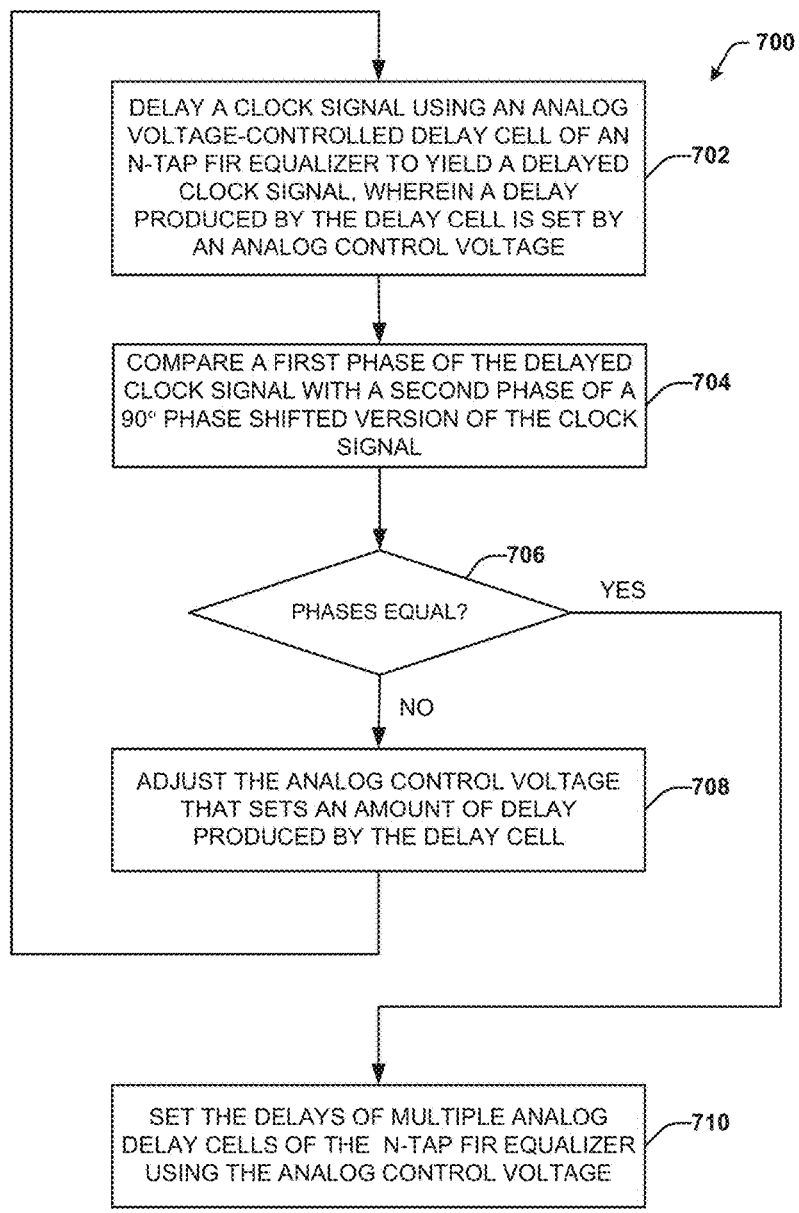
FIG. 7 illustrates a flow diagram of an example, non-limiting embodiment of a method for producing 1 T-spaced (or symbol spaced) delays in an FIR equalizer using analog components.
Figure 8:
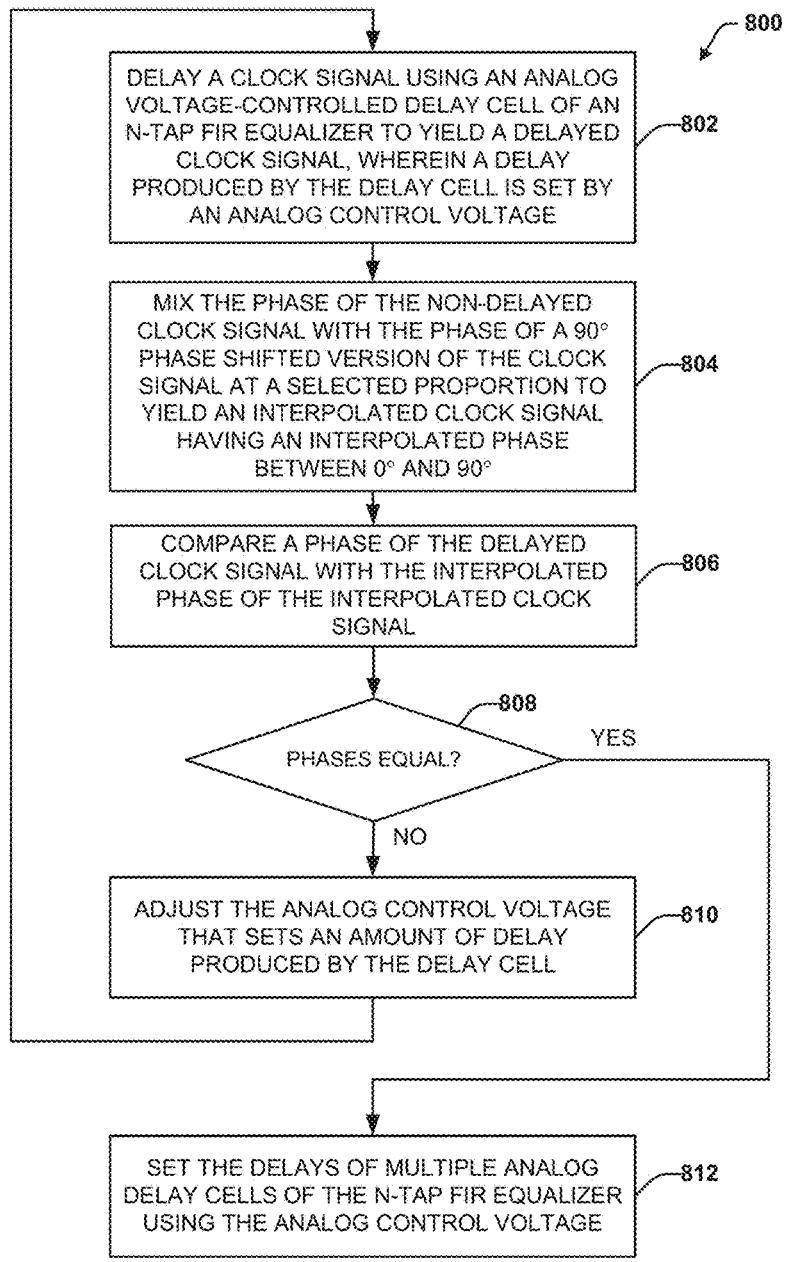
FIG. 8 illustrates a flow diagram of an example, non-limiting embodiment of a method for producing fractionally spaced delays in an FIR equalizer using analog components.

In view of the example systems described above, methods that may be implemented in accordance with the described subject matter may be better appreciated with reference to the flowcharts of FIGS. 7-8. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter. The methods described below can be implemented using hardware, software, or a combination of hardware and software implemented as on-board components of a memory architecture.

FIG. 7 is a flow diagram of an example, non-limiting methodology 700 for producing 1 T-spaced delays in an FIR equalizer using analog components. Methodology 700 begins at step 702, where a clock signal is delayed using an analog voltage-controlled delay cell of an n-tap FIR equalizer to yield a delayed clock signal. The delay cell may be one of several 1 T delay cells that make up the delay block of the n-tap FIR equalizer to produce 1 T-spaced data signals. The amount of delay achieved by the delay cell is controlled using an analog control voltage. The delay cell can be any suitable type of analog-controlled delay circuit, including but not limited to a CMOS inverter, a DLL, an analog differential buffer delay element, an MOS diode-based delay element, a tunable logic gate-based delay element, or other such circuits. In some embodiments, the clock signal may be tapped from the quarter-rate system clock (e.g., a 14 GHz clock signal).

At 704, a first phase of the delayed clock signal produced at step 702 is compared with a second phase of a 90° phase shifted version of the non-delayed clock signal. The comparison can be performed, for example, by a phase frequency detector or another type of phase detecting circuit. To achieve a delay that produces a 1 T spacing between the n-tap data signals, the delay cell should produce a delay that shifts the original clock signal by 90°. Accordingly, the comparison performed at step 704 should determine that the first phase of the delayed clock signal matches the second phase of 90° phase shifted version of the non-delayed clock signal.

At 706, a determination is made, based on the comparison performed at step 704, as to whether the first phase and the second phase are equal, or are nearly equal within a defined tolerance (that is, the difference between the first phase and the second phase is zero or substantially zero within a defined tolerance). If the first phase and the second phase are not equal (NO at step 708), the analog control voltage that sets the delay amount for the delay cell is adjusted. The amount and direction of the control voltage adjustment is based on the difference between the first phase and the second phase. In general, the control voltage will be adjusted in a direction that brings the first phase of the delayed clock signal into alignment with the second phase of the 90° phase shifted version of the non-delayed clock signal (e.g., in a manner that brings the rising edge of a clock pulse of the delayed clock signal into alignment with a rising edge of a corresponding clock pulse of the 90° phase shifted version of the non-delayed clock signal). The methodology then returns to step 702, and steps 702-708 are repeated until the first phase and the second phase are determined to be equal.

If the first phase and the second phase are determined to be equal (YES at step 706), the methodology proceeds to step 710, where the delays of multiple analog delay cells of the n-tap FIR equalizer are set using the adjusted analog control voltage that was determined to bring the first phase of the delayed clock signal into alignment with the second phase of the 90° phase shifted version of the non-delayed clock signal. In this way, each delay cell produces the desired 1 T n-tap spacing.

FIG. 8 is a flow diagram of an example, non-limiting methodology 800 for producing fractionally spaced delays (delays of less than 1 T, such as 0.5 T or 0.75 T) in an FIR equalizer using analog components. Methodology 800 begins at step 802, where a clock signal is delayed using an analog voltage-controlled delay cell of an n-tap FIR equalizer to yield a delayed clock signal. As in methodology 700, the delay cell may be one of several delay cells that make up the delay block of an n-tap FIR equalizer. In this example, however, rather than producing 1 T-spaced data signals, the delay cells are to produce fractionally spaced delays. Also similar to methodology 700, the amount of delay achieved by the delay cell is controlled using an analog control voltage, and the delay cell can be any suitable type of analog-controlled delay circuit (e.g., a current starved inverter, a DLL, an analog differential buffer delay element, an MOS diode-based delay element, a tunable logic gate-based delay element, etc.).

At 804, the phase of the non-delayed clock signal is mixed with the phase of a 90° phase shifted version of the non-delayed clock signal at a selected proportion to yield an interpolated clock signal having an interpolated phase between 0° and 90°. In some embodiments, a phase interpolator can be used to mix the phases of the two clock signals and output the interpolated clock signal at a phase that is interpolated between 0° and 90° based on relative weights applied to the two clock signals by the phase interpolator. The interpolated phase of the interpolated clock signal can be selected to correspond to a desired fractional spacing to be achieved by the delay cell. For example, an interpolated phase of 45° will yield a fractional 0.5 T spacing using the techniques set forth in the subsequent steps. Other fractional spacings can be achieve by adjusting the phase of the interpolated clock signal as needed.

At 806, a phase of the delayed clock signal generated at step 802 is compared with the interpolated phase of the interpolated clock signal generated at step 804 (that is, the interpolated phase between 0° and 90°). The comparison can be performed, for example, by a phase frequency detector or another type of phase detecting circuit. Since the interpolated phase of the interpolated clock signal maps to a desired fractional spacing, the delay cell should produce a delay that shifts the phase of the original clock signal by an amount equivalent to the interpolated phase in order to achieve the desired fractional spacing. Accordingly, the comparison performed at step 806 should determine that the phase of the delayed clock signal matches the interpolated phase of the interpolated clock signal.

At 808, a determination is made as to whether the phase of the delayed clock signal and the interpolated phase of the interpolated clock signal are equal. If the phases are not equal (NO at step 808), the methodology proceeds to step 810, where the analog control voltage that sets the amount of delay produced by the delay cell is adjusted. The amount and direction of the adjustment is selected based on the difference between the phase of the delayed clock signal and the interpolated phase of the interpolated clock signal. In general, the analog control voltage is adjusted to alter the delay produced by the delay cell in a manner that brings the phase of the delayed clock signal into alignment with the interpolated phase of the interpolated clock signal (e.g., in a manner that brings the rising edge of a clock pulse of the delayed clock signal into alignment with a rising edge of a corresponding clock pulse of the interpolated clock signal). The methodology then returns to step 802, and steps 802-810 are repeated until the phase of the delayed clock signal and the interpolated phase of the interpolated clock signal are determined to be equal.

If the phase of the delayed clock signal and the interpolated phase of the interpolated clock signal are determined to be equal (YES at step 808), the methodology proceeds to step 812, where the delays of multiple analog delay cells of the n-tap FIR equalizer are set using the adjusted analog control voltage that was determined to bring the phase of the delayed clock signal into alignment with the interpolated phase of the interpolated clock signal. In this way, each delay cell produces the desired fractional n-tap spacing.

Example Computing Environment

Figure 9:
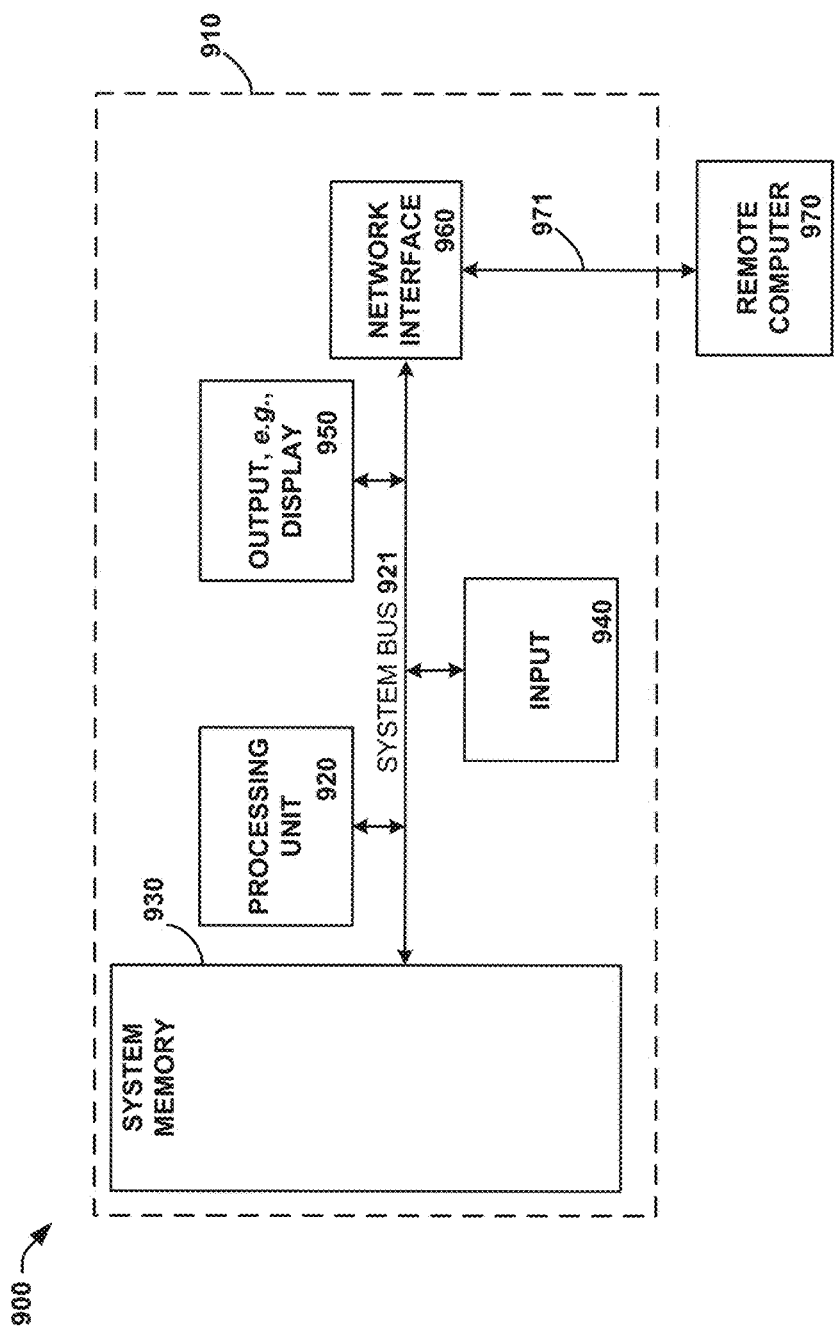
FIG. 9 illustrates a block diagram of an example electronic computing environment that can be implemented in conjunction with one or more aspects described herein.

As mentioned, advantageously, the techniques described herein can be applied to any device where it is desirable to manage signal delay spacing, as in devices that us FIR n-tap transmit equalizers to mitigate the effects of channel loss or ISI. It is to be understood, therefore, that handheld, portable and other computing devices and computing objects of all kinds are contemplated for use in connection with the various non-limiting embodiments. Accordingly, the below general purpose remote computer described below in FIG. 9 is but one example, and the disclosed subject matter can be implemented with any client having network/bus interoperability and interaction. Thus, the disclosed subject matter can be implemented in an environment of networked hosted services in which very little or minimal client resources are implicated, e.g., a networked environment in which the client device serves merely as an interface to the network/bus, such as an object placed in an appliance.

Although not required, some aspects of the disclosed subject matter can partly be implemented via an operating system, for use by a developer of services for a device or object, and/or included within application software that operates in connection with the component(s) of the disclosed subject matter. Software may be described in the general context of computer executable instructions, such as program modules or components, being executed by one or more computer(s), such as projection display devices, viewing devices, or other devices. Those skilled in the art will appreciate that the disclosed subject matter may be practiced with other computer system configurations and protocols.

FIG. 9 thus illustrates an example of a suitable computing system environment 900 in which some aspects of the disclosed subject matter can be implemented, although as made clear above, the computing system environment 900 is only one example of a suitable computing environment for a device and is not intended to suggest any limitation as to the scope of use or functionality of the disclosed subject matter. Neither should the computing system environment 900 be interpreted as having any dependency or requirement relating to any one or combination of components illustrated in the exemplary computing system environment 900.

With reference to FIG. 9, an exemplary device for implementing the disclosed subject matter includes a general-purpose computing device in the form of a computer 910. Components of computer 910 may include, but are not limited to, a processing unit 920, a system memory 930, and a system bus 921 that couples various system components including the system memory to the processing unit 920. The system bus 921 may be any of several types of bus structures including a memory bus or memory controller, a peripheral bus, and a local bus using any of a variety of bus architectures.

Computer 910 typically includes a variety of computer readable media. Computer readable media can be any available media that can be accessed by computer 910. By way of example, and not limitation, computer readable media can comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 910. Communication media typically embodies computer readable instructions, data structures, program modules, or other data in a modulated data signal such as a carrier wave or other transport mechanism and includes any information delivery media.

The system memory 930 may include computer storage media in the form of volatile and/or nonvolatile memory such as read only memory (ROM) and/or random access memory (RAM). A basic input/output system (BIOS), containing the basic routines that help to transfer information between elements within computer 910, such as during start-up, may be stored in memory 930. Memory 930 typically also contains data and/or program modules that are immediately accessible to and/or presently being operated on by processing unit 920. By way of example, and not limitation, memory 930 may also include an operating system, application programs, other program modules, and program data.

The computer 910 may also include other removable/non-removable, volatile/nonvolatile computer storage media. For example, computer 910 could include a hard disk drive that reads from or writes to non-removable, nonvolatile magnetic media, a magnetic disk drive that reads from or writes to a removable, nonvolatile magnetic disk, and/or an optical disk drive that reads from or writes to a removable, nonvolatile optical disk, such as a CD-ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. A hard disk drive is typically connected to the system bus 921 through a non-removable memory interface such as an interface, and a magnetic disk drive or optical disk drive is typically connected to the system bus 721 by a removable memory interface, such as an interface.

A user can enter commands and information into the computer 910 through input devices such as a keyboard and pointing device, commonly referred to as a mouse, trackball, or touch pad. Other input devices can include a microphone, joystick, game pad, satellite dish, scanner, wireless device keypad, voice commands, or the like. These and other input devices are often connected to the processing unit 920 through user input 940 and associated interface(s) that are coupled to the system bus 921, but may be connected by other interface and bus structures, such as a parallel port, game port, or a universal serial bus (USB). A graphics subsystem can also be connected to the system bus 921. A projection unit in a projection display device, or a HUD in a viewing device or other type of display device can also be connected to the system bus 921 via an interface, such as output interface 950, which may in turn communicate with video memory. In addition to a monitor, computers can also include other peripheral output devices such as speakers which can be connected through output interface 950.

The computer 910 can operate in a networked or distributed environment using logical connections to one or more other remote computer(s), such as remote computer 970, which can in turn have media capabilities different from computer 910. The remote computer 970 can be a personal computer, a server, a router, a network PC, a peer device, personal digital assistant (PDA), cell phone, handheld computing device, a projection display device, a viewing device, or other common network node, or any other remote media consumption or transmission device, and may include any or all of the elements described above relative to the computer 910. The logical connections depicted in FIG. 9 include a network 971, such local area network (LAN) or a wide area network (WAN), but can also include other networks/buses, either wired or wireless. Such networking environments are commonplace in homes, offices, enterprise-wide computer networks, intranets and the Internet.

When used in a LAN networking environment, the computer 910 can be connected to the network 971 through a network interface or adapter. When used in a WAN networking environment, the computer 910 can typically include a communications component, such as a modem, or other means for establishing communications over the WAN, such as the Internet. A communications component, such as wireless communications component, a modem and so on, which can be internal or external, can be connected to the system bus 921 via the user input interface of input 940, or other appropriate mechanism. In a networked environment, program modules depicted relative to the computer 910, or portions thereof, can be stored in a remote memory storage device. It will be appreciated that the network connections shown and described are exemplary and other means of establishing a communications link between the computers can be used.

Example Networking Environment

Figure 10:
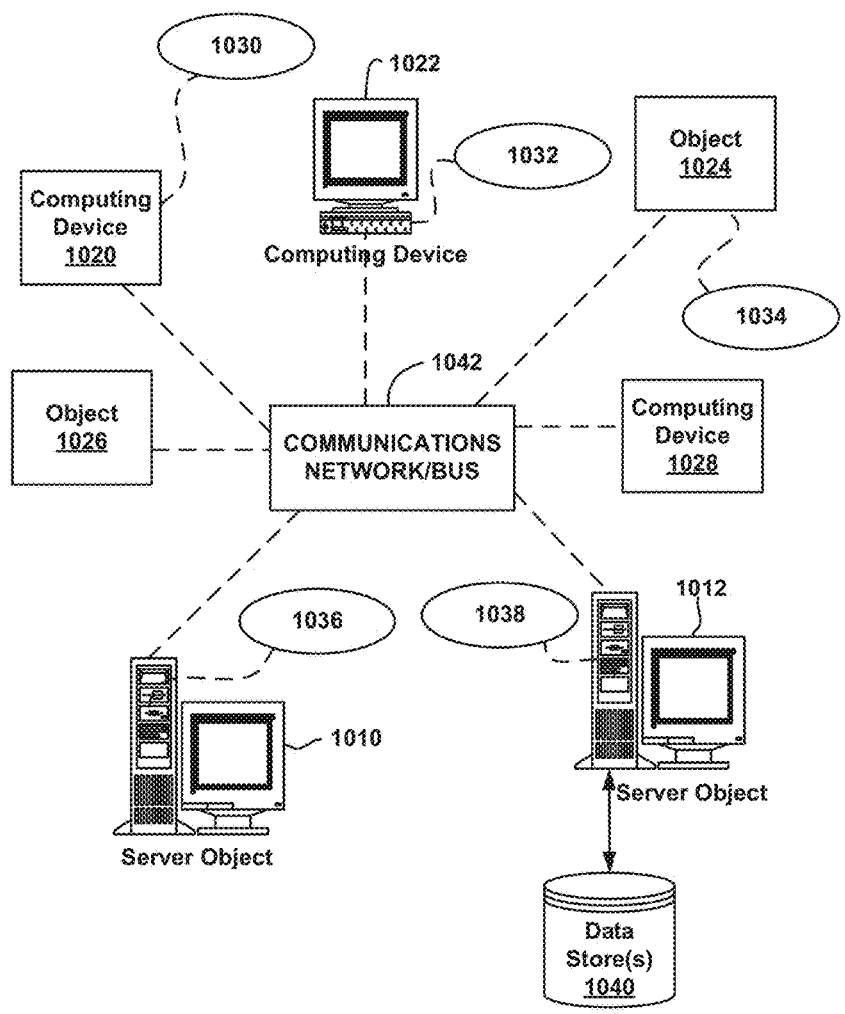
FIG. 10 illustrates a block diagram of an example data communication network that can be operable in conjunction with various aspects described herein.

FIG. 10 provides a schematic diagram of an exemplary networked or distributed computing environment. The distributed computing environment comprises computing objects 1010, 1012, etc. and computing objects or devices 1020, 1022, 1024, 1026, 1028, etc., which may include programs, methods, data stores, programmable logic, etc., as represented by applications 1030, 1032, 1034, 1036, 1038 and data store(s) 1040. It can be appreciated that computing objects 1010, 1012, etc. and computing objects or devices 1020, 1022, 1024, 1026, 1028, etc. may comprise different devices, including a multimedia display device or similar devices depicted within the illustrations, or other devices such as a mobile phone, personal digital assistant (PDA), audio/video device, MP3 players, personal computer, laptop, etc.

Each computing object 1010, 1012, etc. and computing objects or devices 1020, 1022, 1024, 1026, 1028, etc. can communicate with one or more other computing objects 1010, 1012, etc. and computing objects or devices 1020, 1022, 1024, 1026, 1028, etc. by way of the communications network 1042, either directly or indirectly. Even though illustrated as a single element in FIG. 10, communications network 1042 may comprise other computing objects and computing devices that provide services to the system of FIG. 10, and/or may represent multiple interconnected networks, which are not shown. Each computing object 1010, 1012, etc. or computing object or devices 1020, 1022, 1024, 1026, 1028, etc. can also contain an application, such as applications 1030, 1032, 1034, 1036, 1038, that might make use of an API, or other object, software, firmware and/or hardware, suitable for communication with or implementation of the techniques and disclosure described herein.

There are a variety of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the systems automatic diagnostic data collection as described in various embodiments herein.

Thus, a host of network topologies and network infrastructures, such as client/server, peer-to-peer, or hybrid architectures, can be utilized. The "client" is a member of a class or group that uses the services of another class or group to which it is not related. A client can be a process, i.e., roughly a set of instructions or tasks, that requests a service provided by another program or process. The client process utilizes the requested service, in some cases without having to "know" any working details about the other program or the service itself.

In a client/server architecture, particularly a networked system, a client is usually a computer that accesses shared network resources provided by another computer, e.g., a server. In the illustration of FIG. 10, as a non-limiting example, computing objects or devices 1020, 1022, 1024, 1026, 1028, etc. can be thought of as clients and computing objects 1010, 1012, etc. can be thought of as servers where computing objects 1010, 1012, etc., acting as servers provide data services, such as receiving data from client computing objects or devices 1020, 1022, 1024, 1026, 1028, etc., storing of data, processing of data, transmitting data to client computing objects or devices 1020, 1022, 1024, 1026, 1028, etc., although any computer can be considered a client, a server, or both, depending on the circumstances.

A server is typically a remote computer system accessible over a remote or local network, such as the Internet or wireless network infrastructures. The client process may be active in a first computer system, and the server process may be active in a second computer system, communicating with one another over a communications medium, thus providing distributed functionality and allowing multiple clients to take advantage of the information-gathering capabilities of the server. Any software objects utilized pursuant to the techniques described herein can be provided standalone, or distributed across multiple computing devices or objects.

In a network environment in which the communications network 1042 or bus is the Internet, for example, the computing objects 1010, 1012, etc. can be Web servers with which other computing objects or devices 1020, 1022, 1024, 1026, 1028, etc. communicate via any of a number of known protocols, such as the hypertext transfer protocol (HTTP). Computing objects 1010, 1012, etc. acting as servers may also serve as clients, e.g., computing objects or devices 1020, 1022, 1024, 1026, 1028, etc., as may be characteristic of a distributed computing environment.

Reference throughout this specification to "one embodiment," "an embodiment," "an example," "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "engine," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A system for controlling a delay applied to a data signal, comprising:
   a delay cell circuit configured to apply a voltage-controlled delay to incoming data signals, wherein
      the voltage-controlled delay is controlled by an analog control voltage,
      one of the data signals is a clock signal, and
      the delay cell circuit applies the voltage-controlled delay to the clock signal to yield a delayed clock signal;
   a phase interpolator configured to mix a first phase of the clock signal and a second phase of a 90° phase-shifted version of the clock signal to yield an interpolated clock signal having an interpolated phase between 0° and 90°; and
   a phase detection component configured to determine a difference between a third phase of the delayed clock signal and the interpolated phase of the interpolated clock signal, and to set the analog control voltage based on the difference.

2. The system of claim 1, wherein the second phase of the interpolated clock signal is a function of respective weight values applied to the clock signal and the 90° phase-shifted version of the clock signal by the phase interpolator.

3. The system of claim 1, wherein the delay cell circuit is a delay cell circuit of an n-tap finite impulse response transmit equalizer circuit.

4. The system of claim 3, wherein the phase detection component is configured to provide the analog control voltage to multiple delay cell circuits, including the delay cell circuit, of the n-tap finite impulse response transmit equalizer circuit.

5. The system of claim 3, wherein
   another of the data signals is a data signal of a tap of the n-tap finite impulse response transmit equalizer circuit,
   a value of the analog control voltage set by the phase detection component based on the difference causes the delay cell circuit to apply, as the voltage-controlled delay, a fractionally spaced delay to the data stream, and
   the fractionally spaced delay is a function of the interpolated phase of the interpolated clock signal.

6. The system of claim 5, wherein the delay cell circuit is configured to output the data stream with the fractionally spaced delay to one of another delay cell circuit or a quarter-rate multiplexor of the n-tap finite impulse response transmit equalizer circuit.

7. The system of claim 1, wherein the clock signal and the 90° phase-shifted version of the clock signal are generated by a quarter-rate clock of an integrated circuit, a very large scale integration system, or a system-on-chip.

8. The system of claim 1, wherein the phase detection component is configured to set the analog control voltage to a value that brings the third phase of the delayed clock signal into alignment or substantially into alignment with the interpolated phase of the interpolated clock signal.

9. The system of claim 1, wherein the phase detection component comprises a phase frequency detector and a low-pass filter.

10. The system of claim 1, wherein the delay cell circuit is at least one of a CMOS inverter circuit, a current starved inverter circuit, an analog delay-locked loop circuit, an analog differential buffer delay circuit, a MOS diode-based delay circuit, or a tunable logic gate-based delay circuit.

11. A method, comprising:
   delaying, by a delay cell circuit of an n-tap transmit equalizer, a clock signal to yield a delayed clock signal, wherein the delaying comprises delaying the clock signal by a delay amount set by an analog control voltage;
   mixing, by a phase interpolator circuit of the n-tap transmit equalizer, a first phase of the clock signal and a second phase of a 90° phase-shifted version of the clock signal to yield an interpolated clock signal having an interpolated phase between 0° and 90°;
   determining, by a phase detection circuit of the n-tap transmit equalizer, a difference between a third phase of the delayed clock signal with the second phase of the interpolated clock signal; and
   setting, by the phase detection circuit, a value of the analog control voltage based on the difference.

12. The method of claim 11, wherein the mixing comprises interpolating the interpolated phase as a function of respective weight values applied to the clock signal and the 90° phase-shifted version of the clock signal.

13. The method of claim 11, further comprising sending, by the phase detection circuit, the analog control voltage to multiple delay cell circuits, including the delay cell circuit, of the n-tap transmit equalizer.

14. The method of claim 11, further comprising delaying, by the delay cell circuit, a data signal of a tap of the n-tap transmit equalizer to yield a delayed data signal,
wherein the setting the value of the analog control voltage based on the difference causes the delay cell circuit to apply a fractionally spaced delay to the data signal, and wherein the fractionally spaced delay is a function of the interpolated phase.

15. The method of claim 14, further comprising outputting, by the delay cell circuit, the delayed data signal to one of another delay cell circuit of the n-tap transmit equalizer or a quarter-rate multiplexor of the n-tap transmit equalizer.

16. The method of claim 11, wherein the delaying the clock signal comprises delaying a quarter-rate clock signal of an integrated circuit, a very large scale integration system, or a system-on-chip.

17. The method of claim 11, wherein the setting comprises adjusting the value of the analog control voltage until the difference between the third phase and the interpolated phase is zero or near zero within a defined tolerance.

18. The method of claim 11, wherein the determining comprises determining the difference using a phase frequency detector circuit.

19. An n-tap finite impulse response transmit equalizer, comprising:
a delay block configured to convert a data stream to three or more fractionally spaced data streams, the delay block comprising:
multiple delay cell circuits, wherein
each of the multiple delay cell circuits applies a voltage-controlled delay to an incoming data stream in accordance with an analog control voltage, and
a delay cell circuit, of the delay cell circuits, applies the voltage-controlled delay to a clock signal to yield a delayed clock signal;
a phase interpolator circuit configured to interpolate a first phase of the clock signal and a second phase of a 90° phase-shifted version of the clock signal to yield an interpolated clock signal having an interpolated phase between 0° and 90°; and
a phase detection component configured to set the analog control voltage to a value that causes a third phase of the delayed clock signal to align or substantially align with the interpolated phase of the interpolated clock signal.

20. The n-tap finite impulse response transmit equalizer of claim 19, wherein the value of the analog control voltage causes the multiple delay cell circuits to apply a fractionally spaced delay to respective incoming data streams.

* * * * *